United States Patent
Ryan

(10) Patent No.: US 8,367,562 B2
(45) Date of Patent: Feb. 5, 2013

(54) METHOD FOR UNIFORM NANOSCALE FILM DEPOSITION

(75) Inventor: Errol T. Ryan, Clifton Park, NY (US)

(73) Assignee: Globalfoundries Inc., Grand Cayman (KY)

(*) Notice: Subject to any disclaimer, the term of this patent is extended or adjusted under 35 U.S.C. 154(b) by 261 days.

(21) Appl. No.: 12/404,890

(22) Filed: Mar. 16, 2009

(65) Prior Publication Data

US 2010/0233879 A1  Sep. 16, 2010

(51) Int. Cl.
*H01L 21/469* (2006.01)

(52) U.S. Cl. .................................................. 438/791

(58) Field of Classification Search .......... 438/458, 438/791; 118/724
See application file for complete search history.

(56) References Cited

U.S. PATENT DOCUMENTS

| | | | |
|---|---|---|---|
| 6,251,800 B1* | 6/2001 | Sun et al. .................. | 438/763 |
| 6,536,452 B1* | 3/2003 | Kohama et al. ............ | 134/117 |
| 6,809,043 B1 | 10/2004 | Ngo et al. | |
| 7,033,960 B1 | 4/2006 | You et al. | |
| 7,122,827 B2* | 10/2006 | Alizadeh et al. ............ | 257/17 |
| 2002/0104205 A1* | 8/2002 | Goodwin .................... | 29/25.01 |
| 2007/0286963 A1 | 12/2007 | Rocha-Alvarez et al. | |
| 2008/0236495 A1* | 10/2008 | Tompa ........................ | 118/724 |
| 2009/0305498 A1* | 12/2009 | Streck et al. ............... | 438/627 |
| 2010/0112216 A1* | 5/2010 | Gurary et al. ............. | 427/255.28 |

* cited by examiner

*Primary Examiner* — Bradley K Smith
(74) *Attorney, Agent, or Firm* — Ditthavong Mori & Steiner, P.C.

(57) ABSTRACT

Ultrathin layers are deposited by chemical vapor deposition (CVD) with reduced discontinuities, such as pinholes. Embodiments include depositing a material on a wafer by CVD while rotating the CVD showerhead and/or the wafer mounting surface, e.g., at least 45°. Embodiments include rotating the showerhead and/or mounting surface continuously through the deposition of the material. Embodiments also include forming subfilms of the material and rotating the showerhead and/or mounting surface after the deposition of each subfilm. The rotation of the showerhead and/or mounting surface averages out the non-uniformities introduced by the CVD showerhead, thereby eliminating discontinuities and improving within wafer and wafer-to-wafer uniformity.

11 Claims, 5 Drawing Sheets

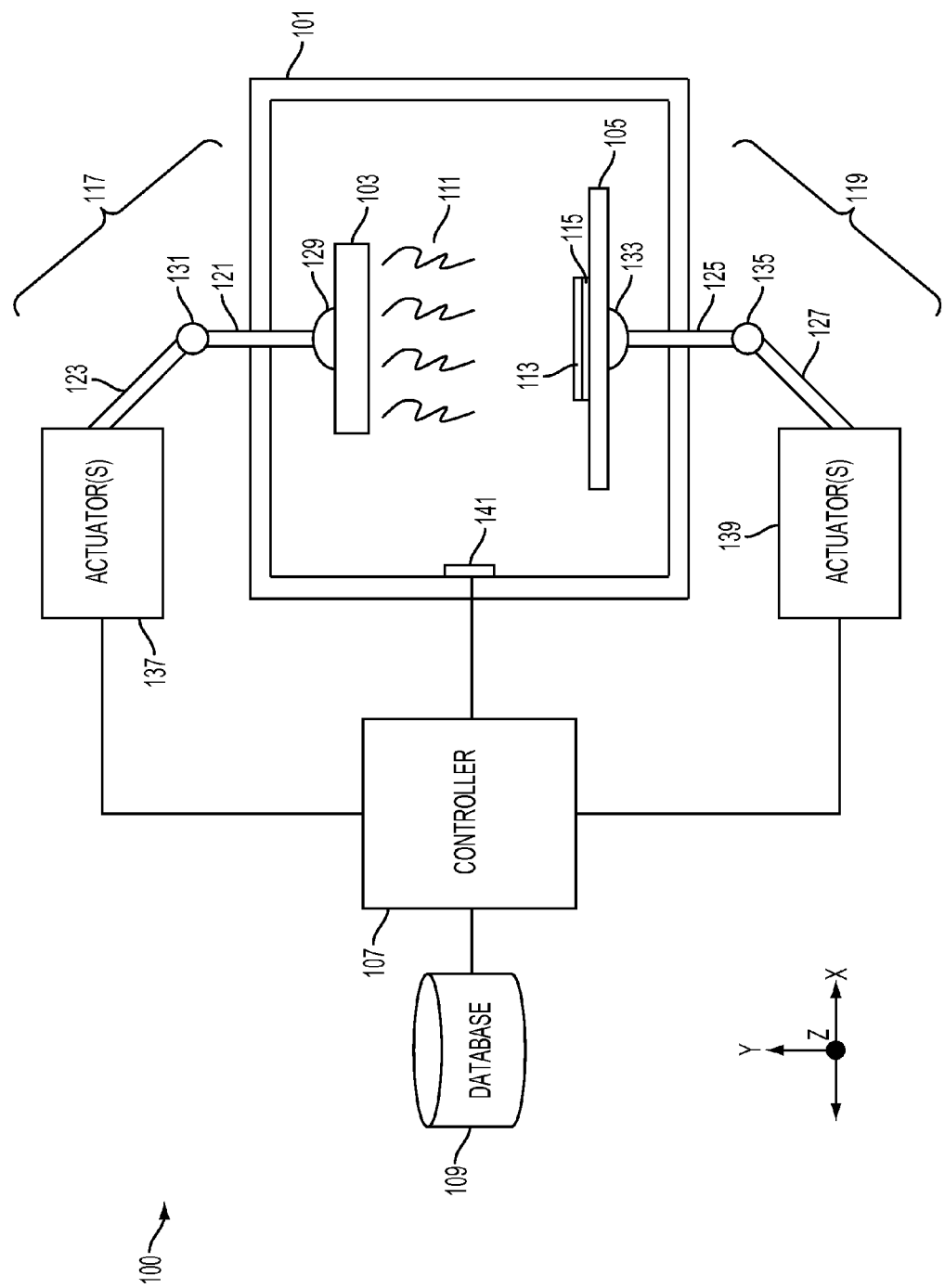

METHOD FOR UNIFORM NANOSCALE FILM DEPOSITION

TECHNICAL FIELD

The present disclosure relates to a method of fabricating miniaturized semiconductor devices exhibiting high reliability and superior repeatability. The present disclosure is particularly applicable in fabricating semiconductor devices with films less than about 50 angstroms (Å) in thickness.

BACKGROUND

As the dimensions of transistor devices continue to shrink, various issues arise imposing increasing demands for methodology enabling the fabrication of semiconductor devices having high reliability and high circuit speed. Smaller transistors allow more transistors to be placed on a single substrate, thereby allowing relatively large circuit systems to be incorporated on a single, relatively small die area. However, smaller transistors require reduced feature sizes. As the gate width for transistors decreases, the gate dielectric thickness decreases as well. The decrease in gate oxide thickness is driven in part by the demands of overall device scaling. As gate conductor widths decrease, for example, other device dimensions must also decrease in order to maintain proper device operation. For 22 nanometer (nm) technology nodes and beyond, it is becoming critical to deposit films less than 50 Å.

Thin films formed from, for example, silicon (Si), silicon carbide (SiC), silicon-germanium ($Si_{1-x}Ge_x$), silicon nitride ($Si_{1-x}N_x$), silicon oxide ($SiO_x$), and the like, find widespread use in the fabrication of semiconductor devices. One approach for forming such thin films on a substrate is through chemical vapor deposition (CVD). Currently depositing films thinner than 50 Å by CVD is difficult because the resulting films are generally discontinuous. The discontinuity is due in part to nucleation and growth phenomena, but more importantly is due to non-uniformities inherent to a CVD tool. Each showerhead in a CVD tool imparts some non-uniformity in the deposited film due to imperfections or subtle, unique flow characteristics.

Novellus has addressed the uniformity problem by using multiple showerhead, or chuck, deposition. In a Novellus tool, the wafer is moved to four or five different chucks for deposition of a portion of the film at each chuck. Since each showerhead introduces its own random non-uniformities, using several chucks is believed to average out the non-uniformities of each. However, it is possible for the non-uniformities of one showerhead to align with those of another. Furthermore, the Novellus solution requires four or more chucks, resulting in a complex and costly system.

A need therefore exists for efficient and cost effective methodology and tools enabling the deposition of ultra thin films with superior within wafer uniformity and excellent repeatability from wafer to wafer.

SUMMARY

An aspect of the present disclosure is an efficient method of fabricating a semiconductor device comprising a film with a thickness about 50 Å or less on a wafer.

Another aspect of the present disclosure is an apparatus for fabricating a semiconductor device comprising a film with a thickness about 50 Å or less on a wafer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: depositing a material on a wafer, by chemical vapor deposition (CVD), and concurrently rotating the wafer and/or CVD showerhead.

Aspects of the present disclosure include depositing the material at a total thickness of about 50 Å or less. Further aspects include rotating the wafer and/or CVD showerhead about a vertical axis. Aspects also include continuously rotating the wafer and/or CVD showerhead through at least about 45°, e.g., about 45° to about 90°. Aspects further include depositing a plurality of sub-films of the material and rotating the wafer and/or CVD showerhead after depositing each sub-film. Further aspects include rotating the wafer and/or CVD showerhead at least three times. Another aspect includes rotating the wafer and/or CVD showerhead a total of at least about 45°, e.g., about 45° to about 90°. Additional aspects include forming a layer containing copper on the wafer and depositing the material, e.g., a silicon nitride capping material, on the layer. Aspects also include depositing the material by metal organic chemical vapor deposition (MOCVD). Aspects further include rotating the wafer and/or CVD showerhead about a horizontal axis.

Another aspect of the present disclosure is an apparatus for depositing a material on a semiconductor wafer by chemical vapor deposition, the apparatus comprising: a deposition chamber; a mounting surface for the semiconductor wafer within the deposition chamber; and a showerhead above the mounting surface, in the deposition chamber, for delivering reactant gases to the semiconductor wafer, the showerhead and/or mounting surface being rotatable.

Aspects include the showerhead and/or mounting surface being rotatable about a vertical axis through at least about 45°, e.g., about 45° to about 90°. A further aspect includes the showerhead and/or mounting surface being rotatable about a horizontal axis.

Another aspect of the present disclosure is a method of manufacturing a semiconductor device, the method comprising: forming a layer containing copper on a wafer; depositing by CVD a silicon nitride capping material to a total thickness of about 50 Å or less on the layer containing copper; and rotating the wafer and/or CVD showerhead about 45° to about 90° about a vertical axis during the deposition.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1 schematically illustrates a cross-sectional diagram of a vapor deposition system, according to an exemplary embodiment;

DETAILED DESCRIPTION

Figure 3:
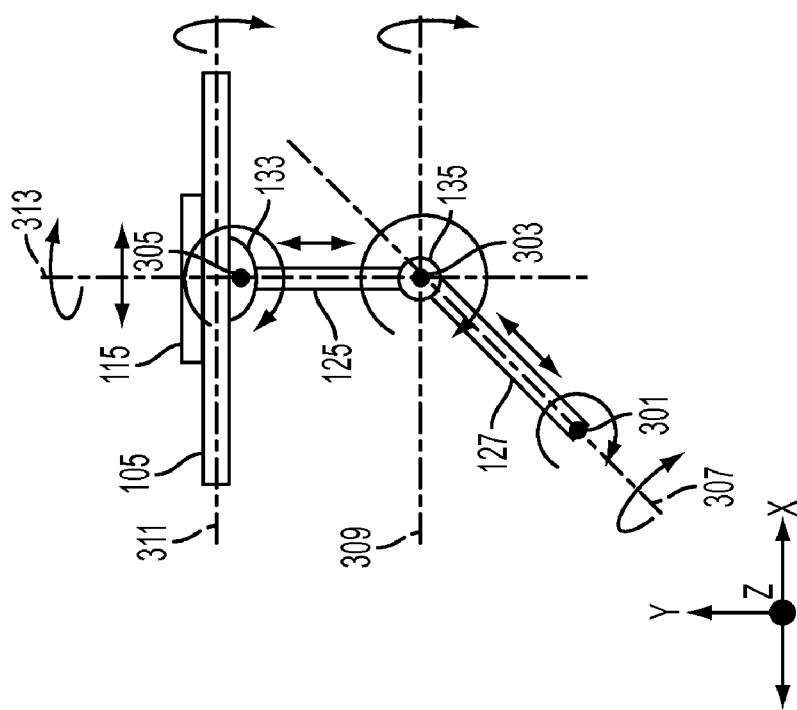
FIG. 3 schematically illustrates a wafer mounting surface of FIG. 1, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of discontinuities, such as pinholes, developing in thin films deposited by CVD, which adversely affect semiconductor performance, as in transistors with films less than about 50 Å in thickness. In accordance with embodiments of the present disclosure, the semiconductor wafer and/or the CVD showerhead is rotated concurrently with depositing a material that forms the thin film, e.g., a silicon nitride capping film. As a consequence of the rotation, any discontinuities that develop during deposition, due to imperfections or unique flow characteristics of the showerhead, do not penetrate all the way through the film, and wafer-to-wafer and within wafer uniformity are improved.

Embodiments of the present disclosure include depositing a material at a total thickness of about 50 Å or less on a wafer, by CVD, and concurrently rotating the wafer and/or CVD showerhead. The rotation may be about a vertical axis or about a horizontal axis. The rotation may be continuous through at least about 45°, for example about 45° to about 90°. Alternatively, a plurality of subfilms may be deposited on a wafer to a total thickness of about 50 Å or less, with a rotation after each deposition. The number of rotations may be at least three, with a total rotation of at least 45°, for example about 45° to about 90°. In accordance with embodiments of the present disclosure, the material may be silicon nitride, forming a capping layer on a copper containing layer. Alternatively, the material may be deposited by metal organic chemical vapor deposition (MOCVD). Such deposition with concurrent rotation significantly improves discontinuity elimination, wafer uniformity, and wafer-to-wafer uniformity.

An apparatus in accordance with embodiments of the present disclosure includes a deposition chamber, a mounting surface for the semiconductor wafer within the deposition chamber, and a showerhead above the mounting surface, in the deposition chamber, for delivering reactant gases to the semiconductor wafer, wherein the showerhead and/or mounting surface is rotatable. The showerhead and/or mounting surface may be rotatable about a vertical axis through at least about 45°, for example about 45° to about 90°. Alternatively, the showerhead and/or mounting surface may be rotatable about a horizontal axis.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

An apparatus in accordance with an embodiment of the present disclosure is illustrated in FIG. 1. As seen in FIG. 1, showerhead 103 may be configured with various injector ports (not shown) configured to inject various types of gases 111 into deposition chamber 101 for forming ultra thin film 113 on wafer 115, which may be supported within deposition chamber 101 via mounting surface 105. In exemplary embodiments, showerhead 103 and/or mounting surface 105 may be respectively supported by one or more manipulators (e.g., manipulators 117 and 119) configured to dynamically modify the spatial configuration of showerhead 103 and/or mounting surface 105 within deposition chamber 101. Manipulators 117 and 119 may be, for example, kinematic chains, such as articulated robotic arms, including one or more links (e.g., links 121, 123, 125, and 127) connected via one or more joints (e.g., joints 129, 131, 133, and 135). In this manner, links 121-127 and joints 129-135 enable various forms of rotational motion and/or translational displacement of showerhead 103 and mounting surface 105, such as dynamically rotating showerhead 103 and/or mounting surface 105 during vapor deposition, relative to an imaginary X, Y, and/or Z axis, for example, dynamically rotating showerhead 103 and/or mounting surface 105 at least 45°, such as about 45° to 90°, relative to one or more of the imaginary X, Y, and Z axes. In addition, showerhead 103 and/or mounting surface 105 may be dynamically translated (or otherwise displaced) within the boundaries of deposition chamber 101. For instance, showerhead 103 and/or mounting surface 105 may be translated over a relatively small range at a high frequency, thereby vibrating the showerhead and/or mounting surface in the X-Y plane.

Figure 2:
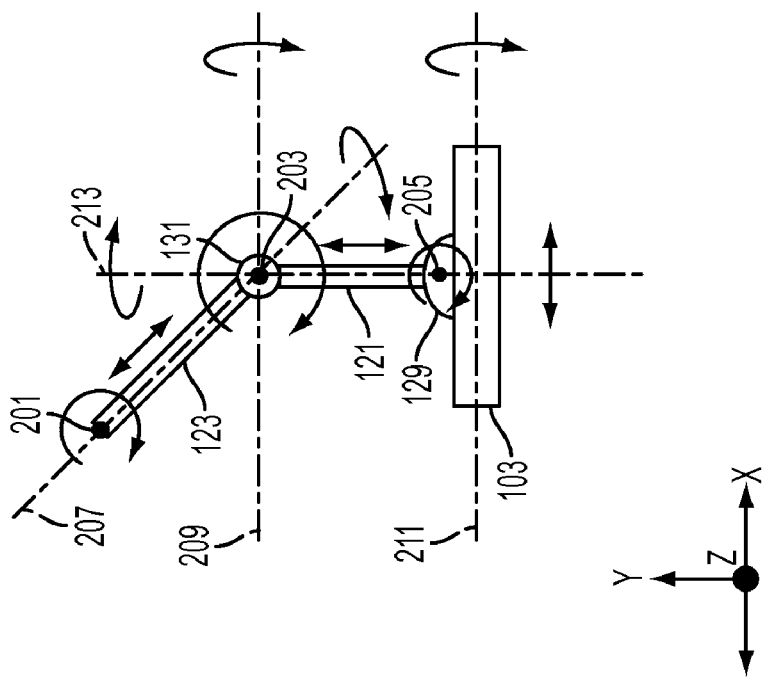
FIG. 2 schematically illustrates a showerhead of FIG. 1, according to an exemplary embodiment.

Illustrative forms of exemplary rotational motions and translational displacements are described with respect to FIGS. 2 and 3. Referring to FIG. 2, links 121 and/or 123, as well as joints 129 and/or 131 enable showerhead 103 to rotate about imaginary axes of rotation 201, 203, and 205 parallel (or substantially parallel) to an imaginary Z axis extending out of the page, as well as rotate about imaginary axes of rotation 207, 209, 211, and 213 respectively parallel (or substantially parallel) to imaginary X and Y axes. Furthermore, links 121 and/or 123 enable translational displacement parallel (or substantially parallel) to imaginary axis 205, as well as imaginary axes 207, 209, and 213.

Referring to FIG. 3, links 127 and/or 125, as well as joints 133 and/or 135 similarly enable mounting surface 105 to rotate about imaginary axes of rotation 301, 303, and 305 parallel (or substantially parallel) to an imaginary Z axis extending out of the page, as well as rotate about imaginary axes of rotation 307, 309, 311, and 313 respectively parallel (or substantially parallel) to imaginary X and Y axes. Moreover, links 125 and/or 127 enable translational displacement parallel (or substantially parallel) to imaginary axis 305, as well as imaginary axes 307, 309, and 313. It is noted that controller 107 may be configured to impart these exemplary rotational motions and/or translational displacements illustrated in FIGS. 2 and 3, as well as various combinations therebetween, continuously during deposition or in (or during) one or more "stages" of vapor deposition, such as three to seven stages, e.g., five stages. Further, while only a certain number of links and joints are depicted, it is contemplated that any suitable number of links and/or joints may be utilized for manipulators 117 and 119 and, thereby, enable various other degrees of freedom.

Averting back to FIG. 1, it is contemplated that manipulators 117 and 119 may be controlled manually; however, in exemplary embodiments, controller 107 is configured to dynamically modify the configuration (e.g., spatial configuration) of showerhead 103 and/or mounting surface 105 via manipulators 117 and 119. More specifically, controller 107 can control manipulators 117 and 119 via one or more actuators (e.g., actuators 137 and 139) according to one or more programs, instructions, and/or data stored to, for example, a memory (not shown) of controller 107 and/or database 109. Although actuators 137 and 139 are illustrated as being outside the vacuum chamber, one or more actuators may alternatively be located inside the vacuum chamber. In certain instances, input from one or more sensors 141 (or other suitable feedback mechanisms) may be provided to controller 107 to facilitate the dynamic control of manipulators 117 and 119, as well as any other suitable aspect relating to the vapor deposition of ultra thin film 113. Sensed conditions (or other feedback information) may also be stored to a memory of controller 107 and/or database 109. As such, exemplary embodiments enable various components of vapor deposition system 100 to be spatially or otherwise configured and, thus, enable vapor deposition system 100 to facilitate increased uniformity in deposition of ultra thin film 113 on wafer 115, such as increased uniformity in deposition of a nanoscale CVD thin film on wafer 115.

The formation of thin film 113 on wafer 115 is initiated with an application of a high frequency RF power, e.g., between about 200 W and about 1000 W, to the showerhead 103. The deposition may occur in an atmosphere of silane, amonia, nitrogen, oxygen, helium, or the like at, for example, 3 mf. The chamber pressure during the deposition may, for example, be about 2 Torr to about 10 Torr, and the deposition temperature may range from about 250° to about 400°. The mounting surface 105 for the semiconductor wafer 115 may be spaced from the showerhead 103 about 200 mil to about 500 mil. Suitable gas flow rates in the chamber will vary according the material being deposited. It should also be noted that the ranges for power and pressure are merely exemplary and may be lower, for example, depending on the materials being deposited. The rotation of the showerhead and/or mounting surface may begin concurrently with the application of power to the showerhead and continue through the entire deposition, about 5 to 20 seconds, with a total rotation of at least 45°, for example 45° to 90°. Alternatively, the material may be deposited as a series of subfilms, for example three to seven, e.g., five. After each subfilm is deposited, the showerhead and/or mounting surface may be rotated, for a total rotation of at least 45°, for example 45° to 90°. The application of power to the showerhead after each rotation initiates deposition of the next subfilm.

Figure 4:
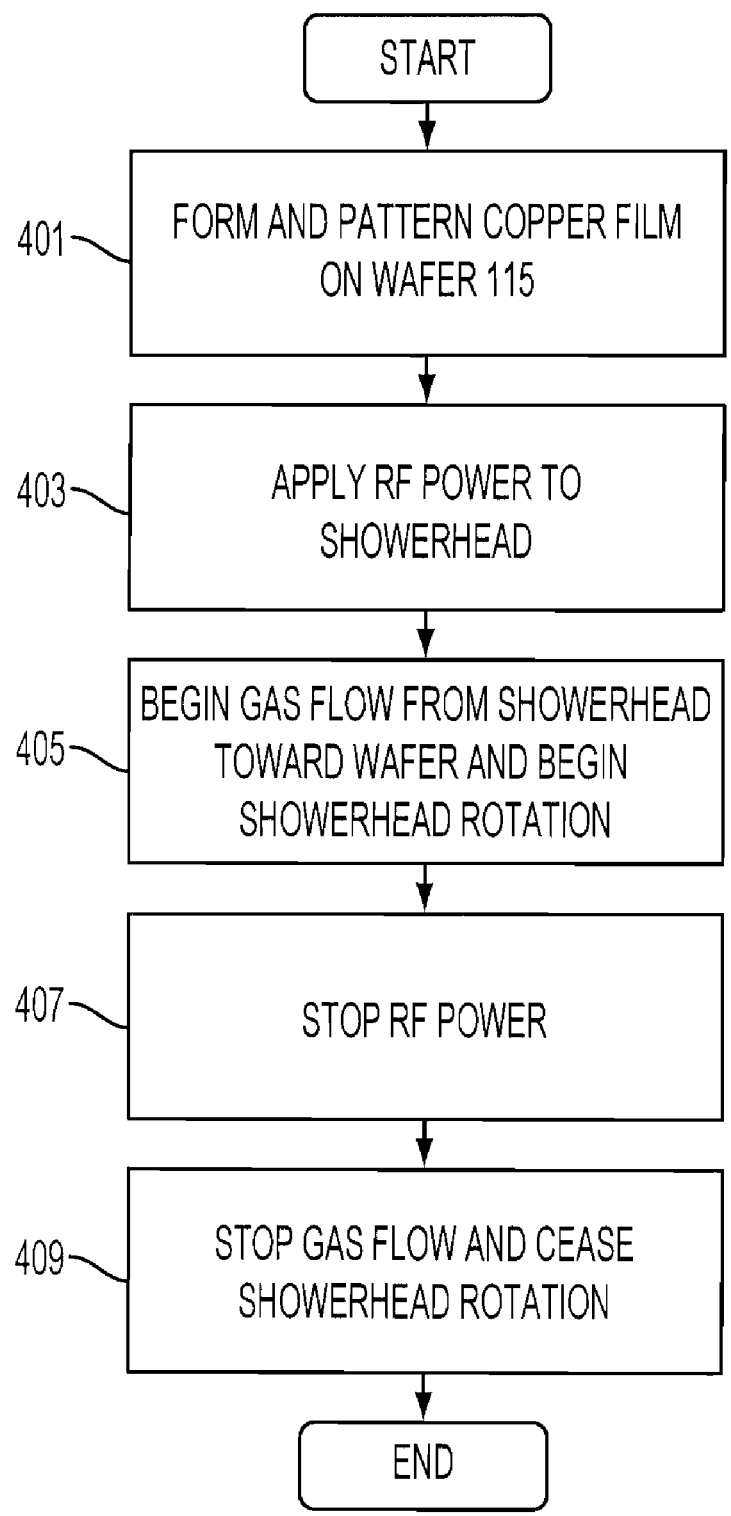
FIG. 4 is a flowchart of a process for chemical vapor deposition, according to an exemplary embodiment.

FIG. 4 is a flowchart of a process for chemical vapor deposition, according to an exemplary embodiment. A copper film is formed and patterned on wafer 115 in step 401. The wafer is then loaded into deposition chamber 101 at step 403 to form a silicon nitride capping layer over the copper film. In step 403, high frequency RF power between about 200W and about 1000W is applied to showerhead 103. In step 405, reactant gas begins to flow from the showerhead toward wafer 115, and the showerhead begins to rotate. During deposition of the silicon nitride layer, reactants employed are $SiH_4$, $N_2$, and ammonia ($NH_3$). When the desired thickness of silicon nitride is reached, after about 5 to 20 seconds, the RF power is removed (step 407). In step 409, the gas stops flowing, and the rotation of the showerhead ceases. Although described with respect to the showerhead rotating, the mounting surface for the wafer may alternatively be rotated. Likewise, the showerhead and mounting surface may be rotated simultaneously, for example in opposite directions or alternatively in the same direction but at different rates of rotation. The rotation for showerhead 103 may be with respect to a vertical axis, e.g., axis 213 in FIG. 2 and/or may be about a horizontal axis, e.g., axis 205 or 211 in FIG. 2. Similarly, rotation of the mounting surface 105 may be about a vertical axis, e.g., axis 313 in FIG. 3 and/or about a horizontal axis, e.g., axis 303 or 309 in FIG. 3.

Figure 5:
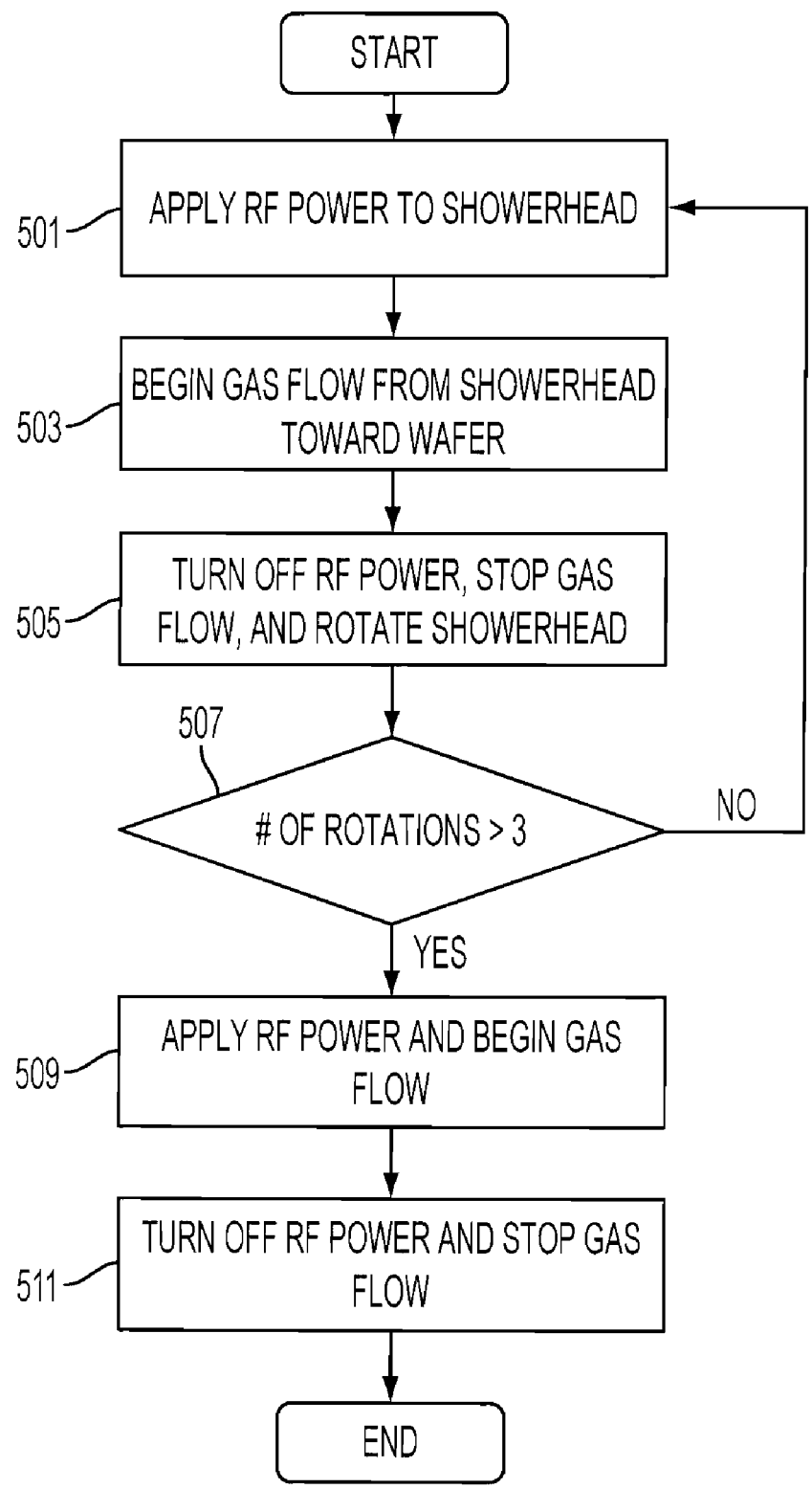
FIG. 5 is a flowchart of a process for chemical vapor deposition, according to an exemplary embodiment.

FIG. 5 is a flowchart of a process for vapor deposition, according to another exemplary embodiment. In step 501, high frequency RF power, e.g., between about 200W and about 1000W, is applied to showerhead 103. In step 503, gas begins to flow from the showerhead toward wafer 115 for 1 to 4 seconds, for example. The RF power is turned off, gas flow ceases, and the showerhead is rotated, e.g., about 15°-30°, at step 505. If the number of rotations is less than three at step 507, the process returns to step 501, and the high frequency RF power is applied and another subfilm is deposited. At step 507, if the showerhead has been rotated three times, RF power is applied one more time and gas flows toward the showerhead for 1 to 4 seconds, for example, at step 509. At step 511, the power is turned off, the gas flow ceases, and the deposition is complete. The resulting thin film may have a thickness of about 50 Å or less. Although described with respect to the showerhead rotating, the mounting surface for the wafer may alternatively be rotated. Likewise, the showerhead and mounting surface may be rotated simultaneously in opposite directions or in the same direction, but at different rates of rotation. In addition, although three rotations are shown in FIG. 5, the number of rotations is merely exemplary and could range from two to six, for example. The direction of rotation for the showerhead 103 and/or the mounting surface 105 may be about a vertical axis, e.g. axis 213 for the showerhead and/or axis 313 for the mounting surface. Alternatively, or additionally, the direction of rotation may be about a horizontal axis, e.g., axis 205 or 211 for the showerhead and/or axis 303 or 309 for the mounting surface.

Figure 6:
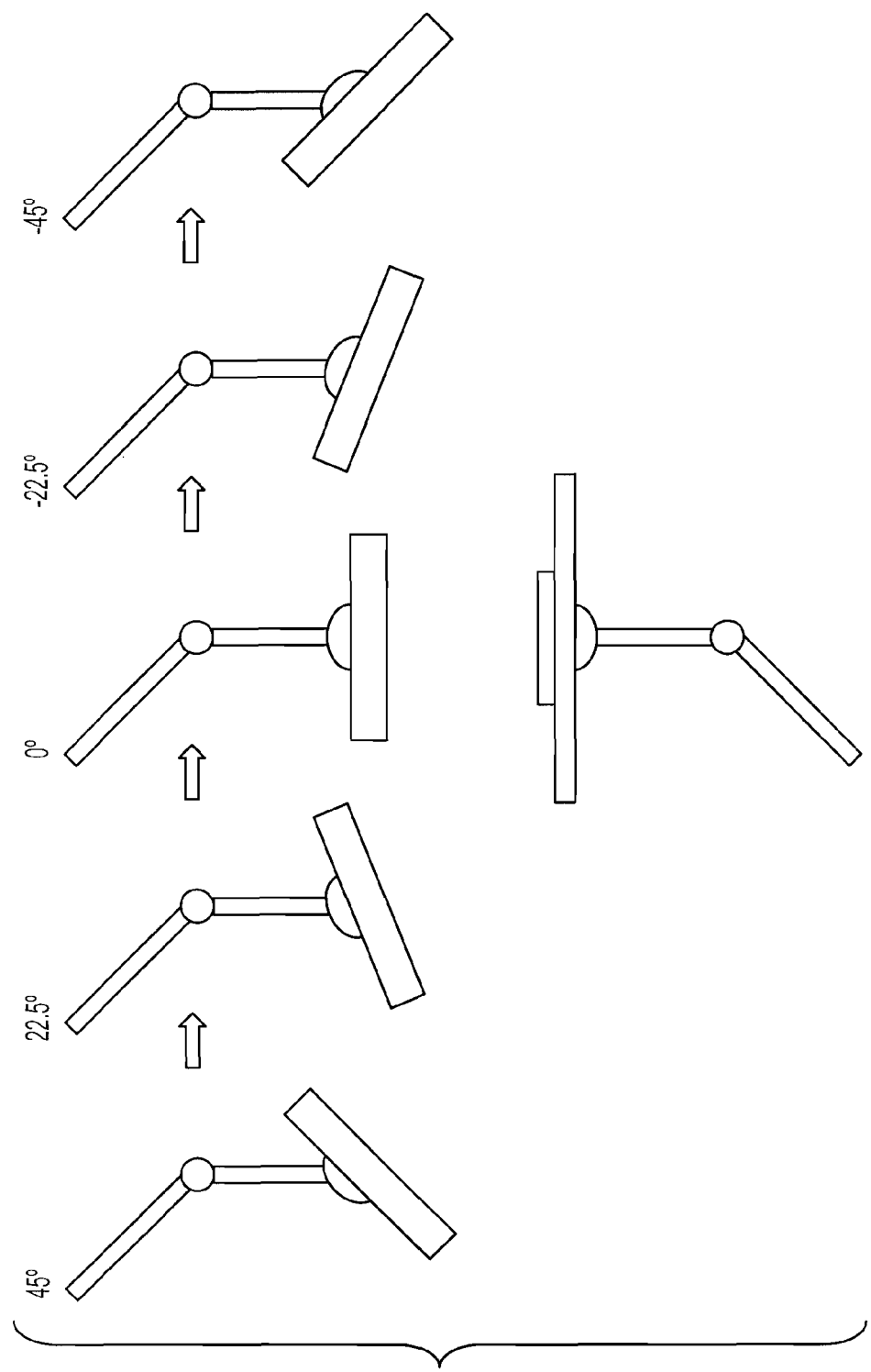
FIG. 6 schematically illustrates a progression of spatial configurations for a showerhead during vapor deposition, according to an exemplary embodiment.

FIG. 6 schematically illustrates a progression of spatial configurations for a showerhead 103 rotating about a horizontal axis during, for example, a chemical vapor deposition process, according to an exemplary embodiment as illustrated in FIG. 5. The showerhead begins at an angle of 45° with respect to the mounting surface 105 and rotates four times about a horizontal axis a total of 90° at increments of 22.5°. It should be readily understood that although only one of the various configurations of the showerhead in FIG. 6 is shown directly above the wafer and mounting surface, all of the showerheads illustrated in FIG. 6 are located directly above the mounting surface.

Various exemplary embodiments are described with respect to CVD. However, it is contemplated that various exemplary embodiments are applicable to any vapor deposition process, such as plasma-enhanced chemical vapor deposition (PECVD), metal organic chemical vapor deposition (MOCVD), physical vapor deposition (PVD), atomic layer deposition (ALD), and the like. In addition, although described as an alternative to using multiple chucks, embodiments of the present disclosure may be used in combination with multiple showerheads, for example two or three, wherein each showerhead rotates during deposition. Further, the various exemplary embodiments are applicable to depositing layers of silicon (Si), silicon carbide (SiC), silicon-germanium ($Si_{1-x}Ge_x$), silicon nitride ($Si_{1-x}N_x$), silicon oxide ($SiO_x$), and the like.

The embodiments of the present disclosure can achieve several technical effects, including reduced discontinuities in thin film depositions in semiconductors, and thus improved semiconductor and circuit performance. The present disclosure enjoys industrial applicability in fabricating any of various types of highly integrated semiconductor devices with submicron dimensions, e.g., with films less than about 50 Å in thickness, with high reliability and uniformity.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of manufacturing a semiconductor device, the method comprising depositing a plurality of sub-films of a material on a wafer, by chemical vapor deposition (CVD), using the same CVD showerhead for all of the sub-films, and rotating the wafer relative to the CVD showerhead about a vertical axis through the center of the wafer and/or rotating the CVD showerhead relative to the wafer about a vertical axis through the center of the CVD showerhead to a different relative position of the wafer and CVD showerhead, during a break in deposition after the deposition of each sub-film.

2. The method according to claim 1, comprising depositing the material at a total thickness of about 50 Å or less.

3. The method according to claim 1, comprising rotating the CVD showerhead.

4. The method according to claim 1, comprising rotating the wafer and/or CVD showerhead at least three times.

5. The method according to claim 4, comprising rotating the wafer and/or CVD showerhead a total of at least about 45°.

6. The method according to claim 5, comprising rotating the wafer and/or CVD showerhead a total of about 45° to about 90°.

7. The method according to claim 6, comprising rotating the CVD showerhead.

8. The method according to claim 1, further comprising forming a layer containing copper on the wafer, and depositing the material on the layer.

9. The method according to claim 8, comprising depositing a silicon nitride capping material on the layer.

10. The method according to claim 1, comprising depositing the material by metal organic chemical vapor deposition (MOCVD).

11. A method of manufacturing a semiconductor device, the method comprising: forming a layer containing copper on a wafer;

depositing by CVD a silicon nitride capping material as a series of sub-films, using the same CVD showerhead for all of the sub-films, to a total thickness of about 50 Å or less on the layer containing copper; and rotating the wafer relative to the CVD showerhead about a vertical axis through the center of the wafer and/or rotating the CVD showerhead relative to the wafer about a vertical axis through the center of the CVD showerhead, during a break between the depositions of each adjacent pair of sub-films, for a total rotation of about 45° to about 90° about the vertical axis.

* * * * *